US008046645B2

(12) United States Patent
Hsu et al.

(10) Patent No.: US 8,046,645 B2
(45) Date of Patent: Oct. 25, 2011

(54) BAD BLOCK IDENTIFYING METHOD FOR FLASH MEMORY, STORAGE SYSTEM, AND CONTROLLER THEREOF

(75) Inventors: Chih-Jen Hsu, Hsinchu County (TW); Yi-Hsiang Huang, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 477 days.

(21) Appl. No.: 12/140,090

(22) Filed: Jun. 16, 2008

(65) Prior Publication Data

US 2009/0259896 A1    Oct. 15, 2009

(30) Foreign Application Priority Data

Apr. 10, 2008    (TW) ................................ 97113038 A

(51) Int. Cl.
*G11C 29/00*    (2006.01)
*G11C 7/00*    (2006.01)
(52) U.S. Cl. ........................................ 714/723; 714/710
(58) Field of Classification Search .................. 714/710, 714/711, 718, 723; 365/200, 201
See application file for complete search history.

(56) References Cited

U.S. PATENT DOCUMENTS

| | | | | |
|---|---|---|---|---|
| 5,513,144 A | * | 4/1996 | O'Toole | 365/200 |
| 5,546,402 A | * | 8/1996 | Niijima et al. | 714/710 |
| 5,577,194 A | * | 11/1996 | Wells et al. | 714/8 |
| 5,648,934 A | * | 7/1997 | O'Toole | 365/200 |
| 5,954,828 A | * | 9/1999 | Lin | 714/723 |
| 6,014,755 A | * | 1/2000 | Wells et al. | 714/8 |
| 7,447,936 B2 | * | 11/2008 | Shiota et al. | 714/5 |
| 2005/0283647 A1 | * | 12/2005 | Ishidoshiro et al. | 714/5 |
| 2006/0080515 A1 | * | 4/2006 | Spiers et al. | 711/162 |
| 2008/0049504 A1 | * | 2/2008 | Kasahara et al. | 365/185.09 |
| 2008/0209282 A1 | * | 8/2008 | Lee et al. | 714/54 |
| 2008/0307270 A1 | * | 12/2008 | Li | 714/47 |
| 2009/0055680 A1 | * | 2/2009 | Honda et al. | 714/5 |

OTHER PUBLICATIONS

Sun, F.; Devarajan, S.; Rose, K.; Zhang, T.; , "Design of on-chip error correction systems for multilevel NOR and NAND flash memories," Circuits, Devices & Systems, IET , vol. 1, No. 3, pp. 241-249, Jun. 2007 doi: 10.1049/iet-cds:20060275 URL: http://ieeexplore.ieee.org/stamp/stamp.jsp?tp=&arnumber=4273065&isnumber=4273056.*

* cited by examiner

Primary Examiner — Cynthia Britt
(74) Attorney, Agent, or Firm — J.C. Patents

(57) ABSTRACT

A bad block identifying method for a flash memory, a storage system, and a controller thereof are provided. The bad block identifying method includes determining whether a programming error occurs in a block of the flash memory after the block is programmed and marking the block as a bad block when the programming error successively occurs in the block. Since the block is determined to be a bad block only when the programming error repeatedly occurs in the block, misjudgment of bad block in the flash memory can be avoided and accordingly the lifespan of the flash memory storage system can be prolonged.

26 Claims, 6 Drawing Sheets

BAD BLOCK IDENTIFYING METHOD FOR FLASH MEMORY, STORAGE SYSTEM, AND CONTROLLER THEREOF

CROSS-REFERENCE TO RELATED APPLICATION

This application claims the priority benefit of Taiwan application serial no. 97113038, filed on Apr. 10, 2008. The entirety of the above-mentioned patent application is hereby incorporated by reference herein and made a part of specification.

BACKGROUND

1. Technology Field

The present invention generally relates to a method for identifying bad blocks in a memory, in particular, to a bad block identifying method for a flash memory, a storage system, and a controller thereof.

2. Description of Related Art

Along with the widespread of digital cameras, camera phones, MP3, and MP4 in recently years, the consumers' demand to storage media has increased drastically too. Among all the existing storage media, flash memory is one of the most adaptable memories for such portable multi-media products due to its characteristics such as data non-volatility, low power consumption, small volume, and non-mechanical structure.

Conventionally, a storage system having a flash memory checks whether a writing or erasing operation it executes to a block in the flash memory is correct or not. If an error occurs during the operation, the block is determined as a bad block, and the block is marked as a bad block or the address thereof is recorded in a bad block management table so that later on the storage system will not use the bad block for storing data.

The cycle time for writing or erasing a flash memory is shortened along with the advancement of the fabricating technique thereof. Besides, the time for writing into a flash memory is further shortened through the technique of programming two pages at one time. However, more noises may be produced in a storage system along with the increment of programming speed, and accordingly, a block may be mistakenly determined as a bad block during a programming operation. Such a misjudged block will be marked in a bad block management table therefore will not be used again so that available system resource (i.e. the block) will be wasted and the lifespan of the flash memory storage system will be shortened.

SUMMARY

Accordingly, the present invention is directed to a bad block identifying method, wherein misjudgement of bad block in a flash memory is avoided so that the lifespan of a flash memory storage system can be prolonged.

The present invention is directed to a storage system, wherein misjudgement of bad block in a flash memory is avoided by a bad block identifying procedure executed by the storage system so that the lifespan of the storage system can be prolonged.

The present invention is directed to a controller, wherein misjudgement of bad block in a flash memory is avoided by a bad block identifying procedure executed by the controller so that the lifespan of a flash memory storage system can be prolonged.

The present invention provides a bad block identifying method. The bad block identifying method includes: detecting whether a programming error occurs in a block of a flash memory after the block is programmed; and marking the block as a bad block when the programming error successively occurs in the block.

According to an embodiment of the present invention, the step of programming the block of the flash memory includes performing a writing operation or an erasing operation to the flash memory.

According to an embodiment of the present invention, the bad block identifying method further includes reading a read status of the programmed block to determine whether the programming error occurs in the block.

According to an embodiment of the present invention, wherein the step of detecting whether a programming error occurs in a block of a flash memory includes detecting data in the programmed block by using an error correcting code (ECC) so as to determine whether the programming error occurs in the block, wherein it is determined that the programming error occurs in the block when the data in the block is incorrect or unrecoverable.

According to an embodiment of the present invention, the step of marking the block as a bad block includes recording the address of the block in a bad block management table.

According to an embodiment of the present invention, the step of marking the block as a bad block includes marking the block as a bad block in a redundant area of at least one page in the block.

According to an embodiment of the present invention, the bad block identifying method further includes recording the number of the programming error successively occurring in the block in a programming error record file, wherein the address of the block is recorded in the bad block management table when the number of the programming error successively occurring in the block is equal to an upper error threshold.

According to an embodiment of the present invention, the upper error threshold is at least 2.

According to an embodiment of the present invention, the bad block identifying method further includes storing the programming error record file in another block of the flash memory or in a static random access memory (SRAM).

The present invention provides a controller suitable for a storage system having a flash memory. The controller includes a microprocessor unit, a flash memory interface, a buffer memory, and a memory management module. The flash memory interface is coupled to the microprocessor unit and is used for accessing the flash memory. The buffer memory is coupled to the microprocessor unit and is used for temporarily storing data. The memory management module is coupled to the microprocessor unit and is used for detecting whether a programming error occurs after the microprocessor unit programs a block of the flash memory and marking the block as a bad block when the programming error successively occur in the block.

According to an embodiment of the present invention, the programming operation includes a writing operation or an erasing operation.

According to an embodiment of the present invention, the memory management module reads a read status of the block to determine whether the programming error occurs in this block.

According to an embodiment of the present invention, the controller further includes an error correction module, wherein the memory management module checks the data in the block through the error correction module and determines that the programming error occurs in the block when the data in the block is incorrect or unrecoverable.

According to an embodiment of the present invention, the memory management module records the address of the block in a bad block management table.

According to an embodiment of the present invention, the memory management module marks the block as a bad block in a redundant area of at least one page in the block.

According to an embodiment of the present invention, the memory management module records the number of the programming error successively occurring in the block in a programming error record file, wherein the address of the block is recorded in the bad block management table when the number of the programming error is equal to an upper error threshold.

According to an embodiment of the present invention, the upper error threshold is at least 2.

According to an embodiment of the present invention, the memory management module stores the programming error record file in another block of the flash memory or in a SRAM.

The present invention provides a storage system including a flash memory, a controller, and a transmission interface. The flash memory is used for storing data. The controller coupled to the flash memory is used for detecting whether a programming error occurs in a block of the flash memory after the block is programmed and marking the block as a bad block when the programming error successively occur in the block. The transmission interface is coupled to the controller and is used for connecting to a host.

According to an embodiment of the present invention, the programming operation includes a writing operation or an erasing operation.

According to an embodiment of the present invention, the controller reads a read status of the block to determine whether the programming error occurs in the block.

According to an embodiment of the present invention, the controller checks data in the block by using an error correction module and determines that the programming error occurs in the block when the data in the block is incorrect or unrecoverable.

According to an embodiment of the present invention, the controller records the address of the block in a bad block management table.

According to an embodiment of the present invention, the controller marks the block as a bad block in a redundant area of at least one page in the block.

According to an embodiment of the present invention, the controller records the number of the programming error successively occurring in the block in a programming error record file, wherein the address of the block is recorded in the bad block management table when the number of the programming error is equal to an upper error threshold.

According to the bad block identifying method in the present invention, a block is determined to be a bad block only when a programming error successively occurs in the block. Thereby, misjudgement of bad block in the flash memory can be avoided and according the lifespan of the flash memory storage system can be prolonged.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
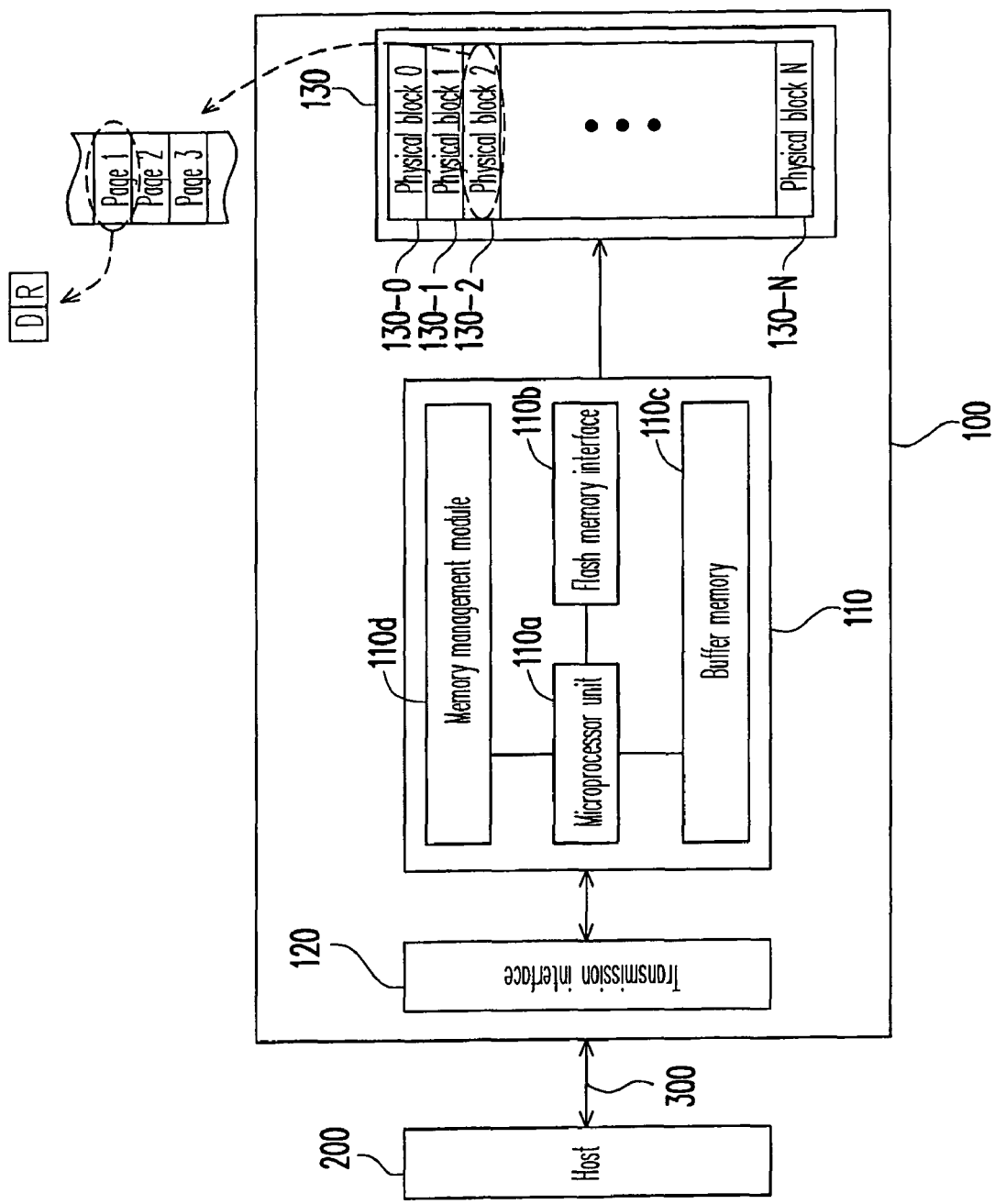
FIG. 1 is a schematic block diagram of a storage system according to a first embodiment of the present invention.

The present invention provides a bad block identifying method, wherein a block is considered a bad block only when a programming error successively occurs in the block. Thus, a block will not be mistakenly determined as a bad block when a programming error caused by other noises occurs in the block. Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1 is a schematic block diagram of a storage system according to the first embodiment of the present invention. Referring to FIG. 1, the storage system 100 includes a controller 110, a transmission interface 120, and a flash memory 130. The storage system 100 is usually used together with a host 200 so that the host 200 can write data into or read data from the storage system 100. In the present embodiment, the storage system 100 is a flash drive; however, in another embodiment of the present invention, the storage system 100 may also be a memory card or a solid state drive (SSD).

The controller 110 coordinates the operation, such as data writing, reading, and erasing etc, between the transmission interface 120 and the flash memory 130. The controller 110 includes a microprocessor unit 110a, a flash memory interface 110b, a buffer memory 110c, and a memory management module 110d.

The microprocessor unit 110a controls the flash memory interface 110b, the buffer memory 110c, and the memory management module 110d to perform writing, reading, and erasing operations to the flash memory 130.

The flash memory interface 110b is electrically connected to the microprocessor unit 110a and used for accessing the flash memory 130. Namely, the data to be written by the host 200 into the flash memory 130 is converted by the flash memory interface 110b into a format acceptable to the flash memory 130.

The buffer memory 110c is electrically connected to the microprocessor unit 110a and used for temporarily storing system data (for example, a mapping table for mapping logical blocks to physical blocks) or data to be read or written by the host 200. In particular, in the present embodiment, the buffer memory 110c is used for storing a programming error record file, wherein the programming error record file is used for recording the addresses of blocks having programming errors. In the present embodiment, the buffer memory 110c is a static random access memory (SRAM). However, the present invention is not limited thereto, and a dynamic random access memory (DRAM), a magnetoresistive random access memory (MRAM), a phase change random access memory (PRAM), or other suitable memories may also be applied in the present invention.

Figure 3:
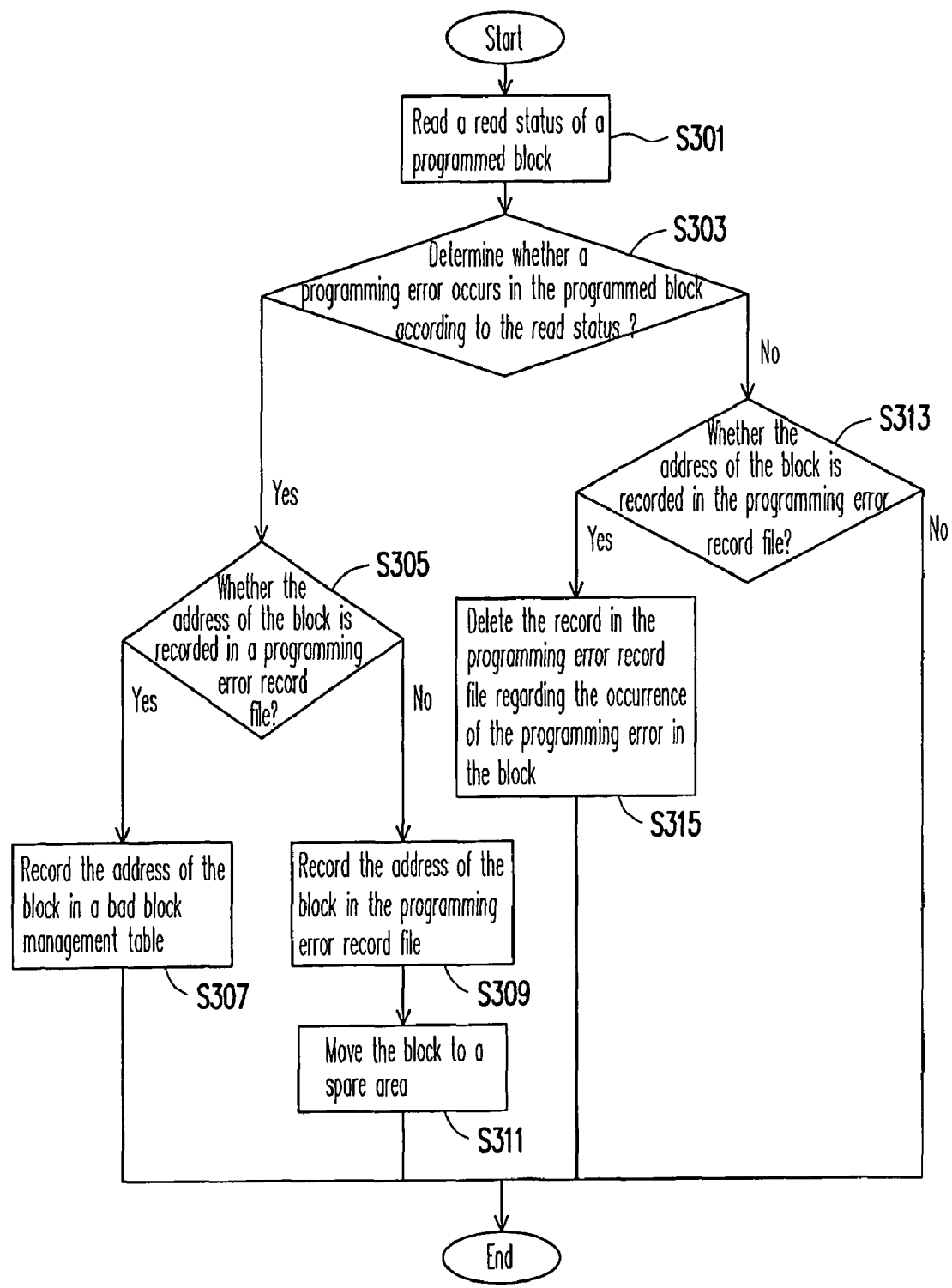
FIG. 3 is a flowchart of a bad block identifying procedure according to the first embodiment of the present invention.

The memory management module 110*d* is electrically connected to the microprocessor unit 110*a* and manages the flash memory 130, such as executes a wear levelling method, manages bad blocks, and maintains a mapping table etc. In particular, in the present embodiment, the memory management module 110*d* executes a bad block identifying procedure provided by the present invention (as shown in FIG. 3). It should be mentioned herein that in the present embodiment, the memory management module 110*d* is implemented as a hardware; however, the memory management module 110*d* may also be implemented as a firmware.

Additionally, even though not shown in the present embodiment, the controller 110 may further include some other general functional modules in a flash memory controller, such as a power management module etc.

The transmission interface 120 is used for connecting to the host 200 through a bus 300. In the present embodiment, the transmission interface 120 is an USB interface. However, the present invention is not limited thereto, and the transmission interface 120 may also be a PCI Express interface, an IEEE 1394 interface, a SATA interface, a MS interface, a MMC interface, a SD interface, a CF interface, an IDE interface, or other suitable data transmission interfaces.

The flash memory 130 is coupled to the controller 110 and used for storing data. In the present embodiment, the flash memory 130 is a multi level cell (MLC) NAND flash memory. However, the present invention is not limited thereto, and in another embodiment of the present invention, the flash memory 130 may also be a single level cell (SLC) NAND flash memory.

The flash memory 130 is usually divided into a plurality of physical blocks 130-0~130-N, and for the convenience of description, these physical blocks will be referred as blocks thereinafter. Generally speaking, data in a flash memory is erased in unit of blocks. Namely, each block contains the smallest number of memory cells which are erased together. A block is usually divided into a plurality of pages, and each page is served as the smallest programming unit. However, it should be noted that in some other different flash memory designs, the smallest programming unit may also be sector, namely, each page contains a plurality of sectors and each sector is served as the smallest programming unit. In other words, page is the smallest unit for writing and reading data. A page usually includes a user data area D and a redundant area R, wherein the user data area D is used for storing user data, and the redundant area is used for storing system data (for example, an error correcting code (ECC)).

Generally, the user data area D has 512 bytes and the redundant area R has 16 bytes in order to correspond to the size of sectors in a disk drive. In other words, a page is a sector. However, a page may also be composed of a plurality of sectors. For example, a page may include four sectors.

Generally, a block may be composed of any number of pages, such as 64 pages, 128 pages, and 256 pages etc. The blocks 130-0~130-N are usually grouped into a plurality of zones. By managing operations of a flash memory based on zones, parallelism of the operations can be increased and the management can be simplified.

Below, the operations of a flash memory will be described in detail according to the present invention with reference to accompanying drawings. It should be understood that the terms "select", "move", and "substitute" used in following description only refer to logical operations performed to a flash memory. In other words, the physical positions of blocks in the flash memory are not changed; instead, these blocks in the flash memory are only operated logically.

Figure 2A:
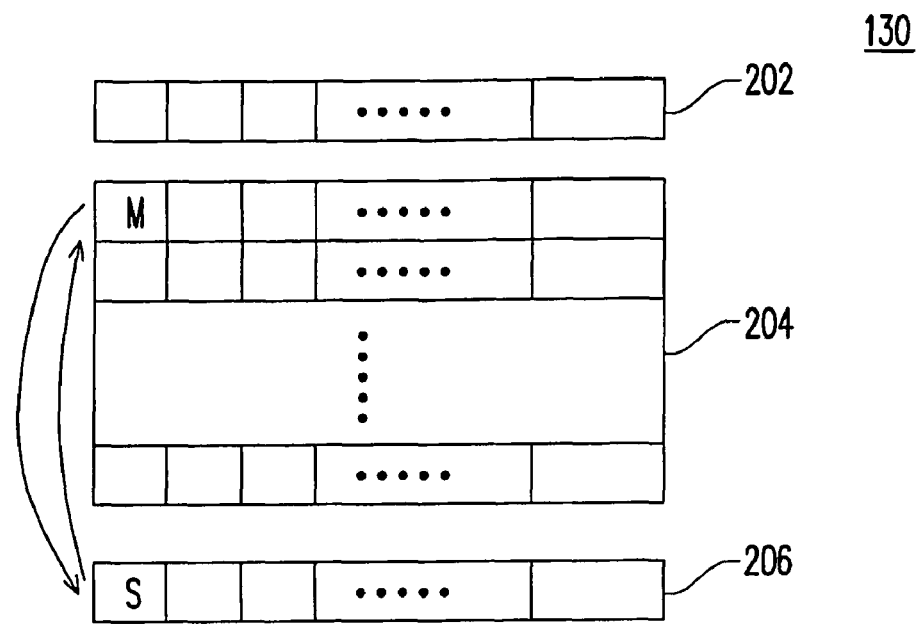
FIGS. 2A~2C are detailed block diagrams illustrating a flash memory and the operations thereof according to the first embodiment of the present invention.
Figure 2B:
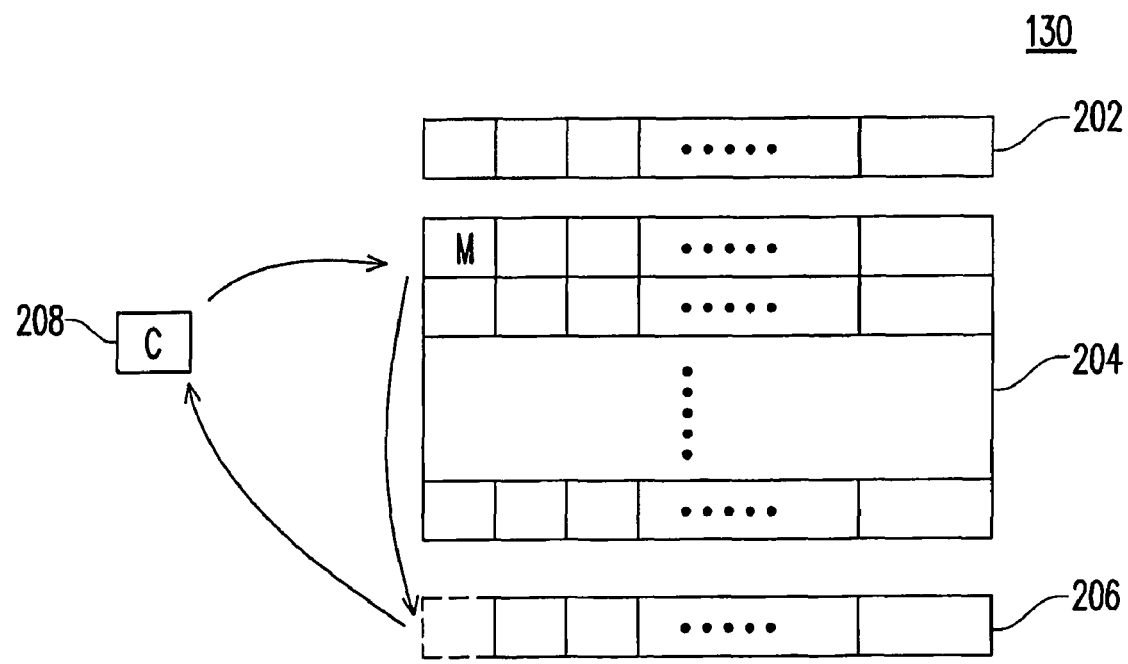
Figure 2C:
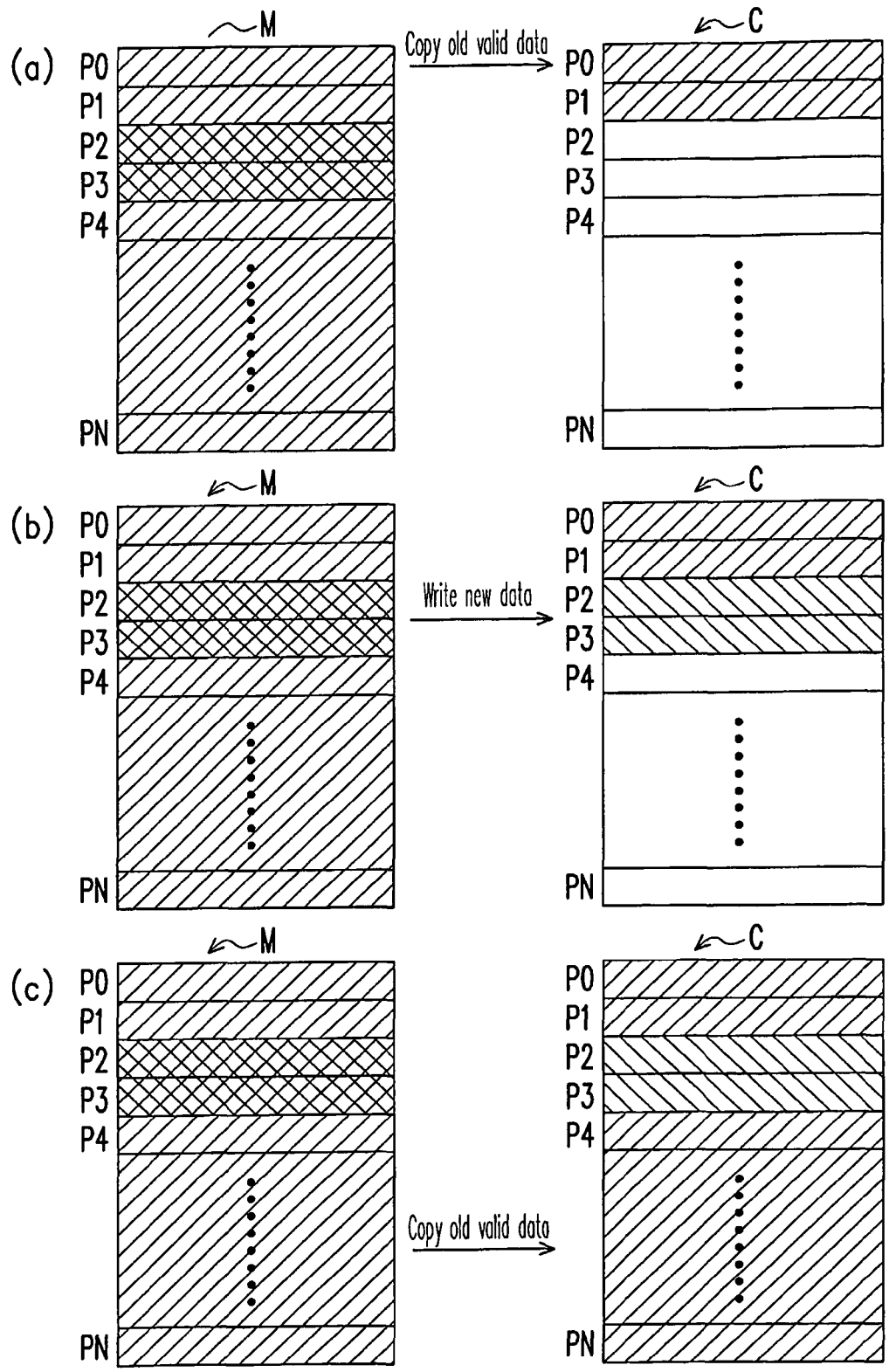

FIGS. 2A~2C are detailed block diagrams illustrating the flash memory 130 and the operations thereof according to the first embodiment of the present invention.

Referring to FIG. 2A, in the present embodiment, in order to program (i.e. write and erase) the flash memory 130 more efficiently, the blocks 130-1~130-N of the flash memory 130 are logically grouped into a system area 202, a data area 204, and a spare area 206. Generally speaking, more than 90% of the blocks in the flash memory 130 belong to the data area 204.

Blocks in the system area 202 are used for storing system data, such as a logical-physical mapping table and a firmware code etc.

Blocks in the data area 204 are used for storing user data, and these blocks are usually the blocks corresponding to the logical block addresses (LBAs) operated by the host 200.

Blocks in the spare area 206 are used for substituting the blocks in the data area 204. Accordingly, blocks in the spare area 206 are blank or available blocks, namely, no data is recorded in these blocks or data recorded in these blocks has been marked as invalid data. To be specific, an erasing operation has to be performed before writing data to an address which already contains data. However, as described above, data is written into a flash memory in unit of pages while erased from the same in unit of blocks. Since the erase unit is larger than the write unit, before erasing data from a block, those valid pages in the block have to be copied to another block. Accordingly, to write a new data into a block M in the data area 204 in which a data has been recorded, a block S is first selected from the spare area 206, and the valid data in the block M is copied to the block S and the new data is also written into the block S. After that, the block M is erased and moved to the spare area 206, and at the same time, the block S is moved to the data area 204. It has to be understood that moving the block M to the spare area 206 and moving the block S to the data area 204 means that the block M is logically linked to the spare area 206 and the block S is logically linked to the data area 204. It should be understood by those having ordinary knowledge in the art that the logical relationship between the blocks in the data area 204 can be maintained through a logical-physical mapping table.

Generally, the blocks 130-0~130-N are further logically grouped into a substitute block 208 in order to use the flash memory 130 more efficiently. FIG. 2B illustrates another operation of the flash memory, and FIG. 2C illustrates the detailed operation of the flash memory as illustrated in FIG. 2B.

Referring to FIG. 2B and FIG. 2C, the substitute block 208 is a temporary block which is selected from the spare area 206 and used for substituting the blocks in the data area 204. To be specific, when a block C is selected from the spare area 206 for substituting a block M in the data area 204, the new data is written into the block C, but not all the valid data in the block M is instantly moved to the block C to erase the block M. To be specific, valid data (i.e. pages P0 and P1) in the block M before the address for writing the new data is copied into the block C (as shown in FIG. 2C(a)), and the new data (i.e. pages P2 and P3 in the block C) is written into the block C (as shown in FIG. 2C(b)). Here, the block C containing part of the old valid data and the new data is temporarily linked as the substitute block 208. This is because the valid data in the block M may become invalid in the next operation, and accordingly instantly moving all the valid data in the block M to the physical block C may become meaningless. In the present example, the fact that a plurality of physical block addresses (PBAs) are mapped to one LBA is recorded in a logical-physical block mapping table, namely, the combination of the contents in the block M and the block C is the content of the corresponding logical block. Such a mother-child block (block M and block C) relationship can be determined according to the size of the buffer memory 110*d* in the controller 110, and in the present embodiment, five mappings are described as an example.

Thereafter, the block M and the block C are only integrated into one block when the contents in the block M and the block C are to be actually combined, so that the efficiency in using these blocks can be improved. For example, as shown in FIG. 2C(c), to integrate the blocks, the remaining valid data in the block M (i.e. pages P4~PN) is coped to the block C, and the block M is then erased and linked to the spare area 206 and the block C is linked to the data area 204. By now the integration of these blocks is completed.

It should be mentioned herein that during the operation illustrated in FIG. 2A or FIG. 2B and FIG. 2C, if the block M or the block C is determined to be a bad block after it is written or erased, the block M or the block C is not moved to the spare area 206. In other words, a bad block will not be alternatively used in the system, and accordingly the number of blocks in the spare area will be decreased. The storage system 100 becomes invalid when there are not enough blocks in the spare area to be alternatively used by the storage system 100.

FIG. 3 is a flowchart of a bad block identifying procedure according to the first embodiment of the present invention.

In the present embodiment, the bad block identifying procedure is started after the microprocessor unit 110*a* of the controller 110 executes a programming operation (i.e. a writing operation or an erasing operation). Referring to FIG. 3, in step S301, a read status of a programmed block is read, and in step S303, whether a programming error occurs in the programmed block is determined according to the read status. To be specific, in the present embodiment, the flash memory 130 offers a status reading function, and the memory management module 110*d* determines whether the programming error occurs in the block by reading the status.

If it is determined in step S303 that the programming error occurs in the block, then in step S305, a programming error record file is read and whether the address of the block is recorded in the programming error record file is determined. The memory management module 110*d* may determines that the programming error has successively occurred in the block if it is determined in step S305 that the address of the block is recorded in the programming error record file. Accordingly, in step S307, the address of the block is recorded in a bad block management table so that the block is considered a bad block therefore will not be used again. If it is determined in step S305 that the address of the block is not recorded in the programming error record file, then in step S309, the address of the block is recorded in the programming error record file, and in step S311, the block is moved to the spare area 206 to be used later on.

If it is determined in step S303 that the block is correctly programmed (i.e. the programming error does not occur), then in step S313, the programming error record file is read and whether the address of the block is recorded in the programming error record file is determined. If it is determined in step S313 that the address of the block is recorded in the programming error record file, the address of the block is deleted from the programming error record file in step S315. In other words, because the programming error occurs when the block is previously programmed, the address thereof is recorded in the programming error record file. However, the programming error does not occur in the block when the microprocessor unit 110*a* programs the block once again. Thus, the memory management module 110*d* determines that the block is not really a bad block and clears the record indicating that the programming error occurs in the block in step S315.

In the present embodiment, the programming error record file is recorded and updated in the buffer memory 110*c*. Thus, once the storage system 100 is re-started or turned on, the storage system 100 has to re-establish the programming error record file to record blocks having programming errors. However, according to another embodiment of the present invention, the programming error record file may be recorded in a block of the flash memory 130 (for example, a block in the system area 202) so that the programming error record file can be loaded into the storage system 100 when the storage system 100 is re-started to continue to record blocks having programming errors.

In addition, according to another embodiment of the present invention, the programming error record file may further record the number of the programming error successively occurring in the block so that the block can be determined as a bad block only when the number of the programming error successively occurring in the block is equal to an upper error threshold, wherein the upper error threshold can be determined according to the quality of the flash memory or the possibility of misjudgement in the storage system. For example, the upper error threshold can be set to 2, 3, or 5.

In the present embodiment, the programming error record file and the bad block management table are respectively used for recording blocks having programming errors and managing bad blocks. However, according to another embodiment of the present invention, when a programming error occurs in a block, the occurrence of the programming error or the number of the successively occurring programming error may also be recorded in the redundant R of at least one page of the block, and when the programming error successively occurs, the block is marked as a bad block in the redundant area R.

In the present embodiment, a block is determined to be a bad block only when a programming error successively occurs in the block two or more times. Thereby, misjudgement caused by other noises can be avoided and accordingly the lifespan of the flash memory storage system can be prolonged.

Second Embodiment

In the first embodiment, whether a programming error occurs in a block is determined through the status reading function of a flash memory. However, according to the present invention, other methods also be adopted for determining whether a programming error occurs in a block.

Figure 4:
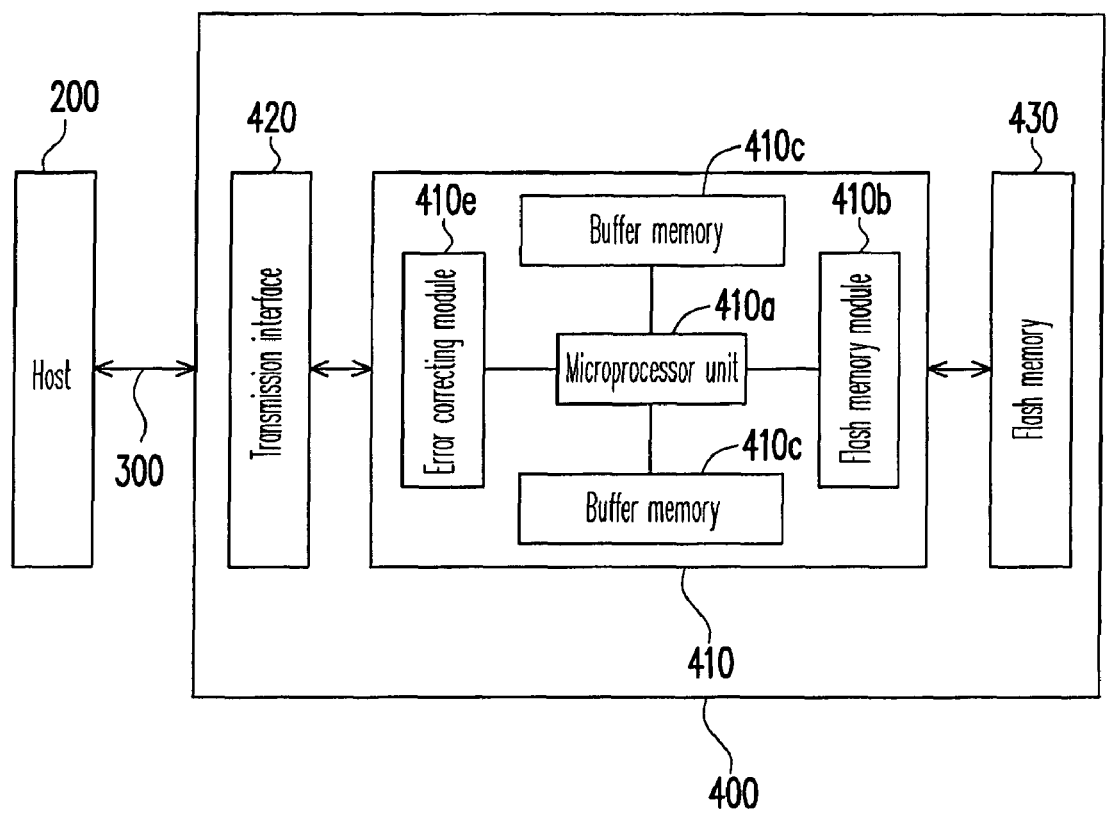
FIG. 4 is a schematic block diagram of a storage system according to a second embodiment of the present invention.

FIG. 4 is a schematic block diagram of a storage system according to the second embodiment of the present invention. Referring to FIG. 4, the storage system 400 includes a controller 410, a transmission interface 420, and a flash memory 430. Similar to the storage system 100, the storage system 400 is usually used together with the host 200 through the bus 300 so that the host 200 can write data into or read data from the storage system 400. In the present embodiment, the storage system 400 is a flash drive. However, in another embodiment of the present invention, the storage system 400 may also be a memory card or a SSD.

Figure 5:
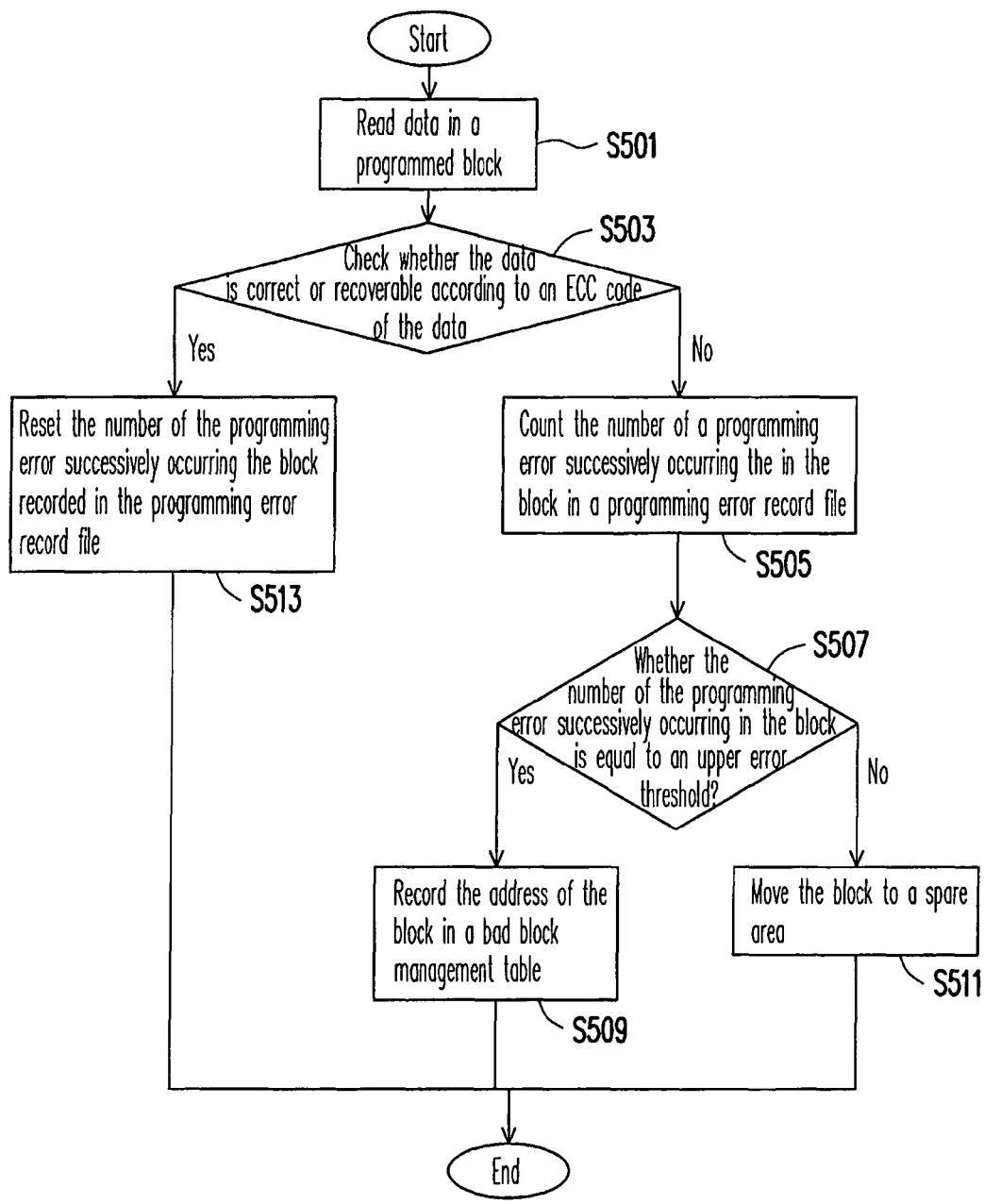
FIG. 5 is a flowchart of a bad block identifying procedure according to the second embodiment of the present invention.

In the present embodiment, the controller 410, the transmission interface 420, and the flash memory 430 are approximately the same as the controller 110, the transmission interface 120, and the flash memory 130 in the first embodiment, and the difference is that the controller 410 further includes an error correction module 410e besides a microprocessor unit 410a, a flash memory module 410b, a buffer memory 410c, and a memory management module 410d, and the memory management module 410d execute a bad block identifying procedure according to the second embodiment of the present invention (as shown in FIG. 5).

The error correction module 410e generates an ECC code to a data to be written and stores the ECC code and the data into the flash memory 430. When subsequently the data is read from the flash memory 430, the error correction module 410e checks whether the data is correct according to the ECC code, or the error correction module 410e tries to recover the data when the data is incorrect.

FIG. 5 is a flowchart of a bad block identifying procedure according to the second embodiment of the present invention.

In the present embodiment, the bad block identifying procedure is turned on after the microprocessor unit 410a of the controller 410 executes a programming operation. Referring to FIG. 5, in step S501, data in a programmed block is read, and in step S503, whether the data is correct or recoverable is determined according to an ECC code of the data, so as to determine whether a programming error occurs in the programmed block.

If it is determined in step S503 that the data is incorrect or unrecoverable, then in step S505, the number of the programming error occurring the block is counted in a programming error record file (for example, by increasing the number by 1). After that, in step S507, whether the number of the programming error occurring in the block is equal to an upper error threshold is determined, wherein the upper error threshold can be determined according to the quality of the flash memory or the possibility of misjudgement in the storage system. For example, the upper error threshold can be set to 2, 3, or 5. If it is determined in step S507 that the number of the programming error occurring in the block is equal to the upper error threshold, then in step S509, the address of the block is recorded in a bad block management table so that the block is considered a bad block and will not be used again. If it is determined in step S507 that the number of the programming error occurring in the block is less or not equal to the upper error threshold, then in step S511, the block is moved to the spare area 206 to be used later on.

If it is determined in step S503 that the data is correct or is recoverable, then in step S513, the number of the programming error occurring in the block is reset in the programming error record file (for example, the number is set to 0). In other words, if the number is set to 0 from a larger value, it can be understood that even though the programming error previously occurs in the block, it does not occur again in the block when the microprocessor unit 410a programs the block again. Thus, the memory management module 410d determines that the block is not really a bad block, and in step S513, the record of occurrence of the programming error is cleared.

In the present embodiment, the programming error record file is recorded and updated in the buffer memory 410c. Thus, once the storage system 400 is re-started or turned on, the storage system 400 has to re-establishes the programming error record file to record blocks having programming errors. However, according to another embodiment of the present invention, the programming error record file may also be recorded in the flash memory 430 so that it can be loaded into the storage system 400 when the storage system 400 is re-started to continue to record blocks having programming errors.

Additionally, in another embodiment of the present invention, the programming error record file can record only the address of a block having a programming error, and the block is determined to be a bad block when the programming error successively occurs again in the block, as in the first embodiment.

In the present embodiment, whether a programming error occurs in a block is determined according to an ECC code, and the block is determined to be a bad block only when the programming error successively occurs in the block two or more times. Thereby, misjudgement caused by other noises can be avoided and the lifespan of the flash memory storage system can be prolonged.

In overview, the present invention provides a bad block identifying method, wherein a block is determined to be a bad block only when a programming error successively occurs in the block. Thereby, misjudgement caused by other noises can be avoided and accordingly the lifespan of the flash memory storage system can be prolonged.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bad block identifying method, for a flash memory, wherein the flash memory has a plurality of blocks and the blocks are grouped logically into at least a data area and a spare area, the bad block identifying method comprising:
programming a first block among the blocks;
detecting whether a programming error occurs in the first block after the first block is programmed;
when the programming error does not occur in the first block after the first block is programmed, resetting a programming error count corresponding to the first block;
when the programming error occurs in the first block after the first block is programmed, increasing the programming error count corresponding to the first block by one and determining whether the programming error count corresponding to the first block is equal to an upper error threshold;
when the programming error count corresponding to the first block is not equal to the upper error threshold, moving the first block to the spare area; and
when the programming error count corresponding to the first block is equal to the upper error threshold, marking the first block as a bad block.

2. The bad block identifying method according to claim 1, wherein the step of programming the first block of the flash memory comprises performing a writing operation or an erasing operation to the flash memory.

3. The bad block identifying method according to claim 1, wherein the step of detecting whether the programming error occurs in the first block of the flash memory after the first block is programmed comprises reading a read status of the first block to determine whether the programming error occurs in the first block.

4. The bad block identifying method according to claim 1, wherein the step of detecting whether the programming error occurs in the first block of the flash memory comprises checking data in the first block by using an error correcting code (ECC) so as to determine whether the programming error occurs in the first block,
wherein it is determined that the programming error occurs in the first block when the data in the first block is incorrect or unrecoverable.

5. The bad block identifying method according to claim 1, wherein the step of marking the first block as the bad block comprises recording the address of the first block in a bad block management table.

6. The bad block identifying method according to claim 5, further comprising recording the programming error count corresponding to the first block in a programming error record file.

7. The bad block identifying method according to claim 6, further comprising storing the programming error record file in another block of the flash memory or in a static random access memory (SRAM).

8. The bad block identifying method according to claim 1, wherein the step of marking the first block as the bad block comprises marking the first block as the bad block in a redundant area of at least one page in the first block.

9. The bad block identifying method according to claim 1, wherein the upper error threshold is at least 2.

10. A controller, for controlling a flash memory of a storage system, wherein the flash memory has a plurality of blocks, the controller comprising:
a microprocessor unit, configured to program a first block among the blocks;
a flash memory interface, coupled to the microprocessor unit and configured to access the flash memory;
a buffer memory, coupled to the microprocessor unit and configured to temporarily store data; and
a memory management module, coupled to the microprocessor unit and configured to logically group the blocks into at least a data area and a spare area and detect whether a programming error occurs in the first block after the microprocessor unit programs the first block,
wherein when the programming error does not occur in the first block after the first block is programmed, the memory management resets a programming error count corresponding to the first block,
wherein when the programming error occurs in the first block after the first block is programmed, the memory management module increases the programming error count corresponding to the first block by one and determines whether the programming error count corresponding to the first block is equal to an upper error threshold,
wherein when the programming error count corresponding to the first block is not equal to the upper error threshold, the memory management module moves the first block to the spare area,
wherein when the programming error count corresponding to the first block is equal to the upper error threshold, the memory management module marks the first block as a bad block when the programming error successively occurs in the block.

11. The controller according to claim 10, wherein the microprocessor unit performs a writing operation or an erasing operation to program the first block.

12. The controller according to claim 10, wherein the memory management module reads a read status of the first block to determine whether the programming error occurs in the first block.

13. The controller according to claim 10, further comprising an error correction module, wherein the memory management module checks data in the first block through the error correction module and determines that the programming error occurs in the first block when the data in the first block is incorrect or unrecoverable.

14. The controller according to claim 10, wherein the memory management module records the address of the first block in a bad block management table to mark the first block as the bad block.

15. The controller according to claim 14, wherein the memory management module records the programming error count corresponding to the first block in a programming error record file.

16. The controller according to claim 15, wherein the memory management module stores the programming error record file in another block of the flash memory or in a SRAM.

17. The controller according to claim 10, wherein the memory management module marks the first block as the bad block in a redundant area of at least one page in the first block.

18. The controller according to claim 10, wherein the upper error threshold is at least 2.

19. A storage system, comprising:
a flash memory, for storing data, wherein the flash memory has a plurality of blocks;
a controller, coupled to the flash memory, wherein the controller is configured to logically group the blocks into at least a data area and a spare area, program a first block among the blocks and detect whether a programming error occurs in the first block after the first block is programmed; and
a transmission interface, coupled to the controller and configured to connect to a host,
wherein when the programming error does not occur in the first block after the first block is programmed, the controller resets a programming error count corresponding to the first block,
wherein when the programming error occurs in the first block after the block is programmed, the controller increases the programming error count corresponding to the first block by one and determines whether the programming error count corresponding to the first block is equal to an upper error threshold,
wherein when the programming error count corresponding to the first block is not equal to the upper error threshold, the controller moves the first block to the spare area,
wherein when the programming error count corresponding to the first block is equal to the upper error threshold, the controller marks the first block as a bad block.

20. The storage system according to claim 19, wherein the controller performs a writing operation and an erasing operation to program the first block of the flash memory.

21. The storage system according to claim 19, wherein the controller reads a read status of the first block to determine whether the programming error occurs in the first block.

22. The storage system according to claim 19, wherein the controller checks data in the first block through an error correction module and determines that the programming error occurs in the first block when the data in the first block is incorrect or unrecoverable.

23. The storage system according to claim 19, wherein the controller records the address of the first block in a bad block management table to mark the first block as the bad block.

24. The storage system according to claim 23, wherein the controller records the programming error count corresponding to the first block in a programming error record file.

25. The storage system according to claim 19, wherein the controller marks the first block as the bad block in a redundant area of at least one page in the first block.

26. The storage system according to claim 19, wherein the upper error threshold is at least 2.

* * * * *